(12) United States Patent
Wang et al.

(10) Patent No.: US 12,074,568 B2
(45) Date of Patent: *Aug. 27, 2024

(54) MULTI-CORE OSCILLATOR WITH ENHANCED MODE ROBUSTNESS

(71) Applicant: Apple Inc., Cupertino, CA (US)

(72) Inventors: Hongrui Wang, San Jose, CA (US); Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/941,767

(22) Filed: Sep. 9, 2022

(65) Prior Publication Data
US 2023/0093529 A1 Mar. 23, 2023

Related U.S. Application Data

(63) Continuation of application No. 17/730,721, filed on Apr. 27, 2022, now Pat. No. 11,824,498.

(60) Provisional application No. 63/245,470, filed on Sep. 17, 2021.

(51) Int. Cl.
H03B 5/12 (2006.01)
H03L 7/089 (2006.01)
H03L 7/093 (2006.01)

(52) U.S. Cl.
CPC ......... *H03B 5/1228* (2013.01); *H03B 5/1243* (2013.01); *H03L 7/0891* (2013.01); *H03L 7/093* (2013.01)

(58) Field of Classification Search
CPC .................................... H03B 5/1228
USPC .................................... 331/117 FE
See application file for complete search history.

(56) References Cited

U.S. PATENT DOCUMENTS

| | | | |
|---|---|---|---|
| 9,369,085 B1* | 6/2016 | Leong | H03B 5/1225 |
| 9,473,067 B2 | 10/2016 | Shi | |
| 9,762,181 B2 | 9/2017 | Jajoo | |
| 9,819,307 B2 | 11/2017 | Farazian | |
| 10,389,301 B2 | 8/2019 | Djahanshahi | |
| 10,749,470 B2 | 8/2020 | Djahanshahi | |
| 10,924,124 B2 | 2/2021 | Leibowitz | |

(Continued)

FOREIGN PATENT DOCUMENTS

| | | | |
|---|---|---|---|
| EP | 3319229 A2 | 5/2018 | |
| WO | 2016/204935 A1 | 12/2016 | |

OTHER PUBLICATIONS

Extended European Search Report for EP Patent Application No. 22188372.1 dated Feb. 17, 2023; 9 pgs.

*Primary Examiner* — Joseph Chang
(74) *Attorney, Agent, or Firm* — FLETCHER YODER PC

(57) ABSTRACT

Voltage-controlled oscillation circuitry includes multiple cores and multiple mode or gain boosters coupled between the multiple cores. To prevent an undesired operating mode of the voltage-controlled oscillation circuitry from dominating a desired operating mode (e.g., an in-phase operating mode or an out-of-phase operating mode), the mode boosters may increase a desired gain of the desired operating mode and decrease an undesired gain of the undesired operating modes. In particular, mode boosters coupled to terminals of the cores that are associated with the desired operating mode may be enabled, while mode boosters coupled to terminals of the cores that are associated with the undesired operating mode may be disabled.

20 Claims, 17 Drawing Sheets

(56) References Cited

U.S. PATENT DOCUMENTS

2009/0027091 A1    1/2009   Yamaguchi et al.
2009/0137213 A1    5/2009   Rofougaran et al.
2020/0144964 A1    5/2020   Mikhail et al.

\* cited by examiner

MULTI-CORE OSCILLATOR WITH ENHANCED MODE ROBUSTNESS

CROSS-REFERENCE TO RELATED APPLICATIONS

This application is a continuation of U.S. application Ser. No. 17/730,721 entitled "MULTI-CORE OSCILLATOR WITH ENHANCED MODE ROBUSTNESS," filed Apr. 27, 2022, which claims priority to U.S. Provisional Application No. 63/245,470, entitled "MULTI-CORE OSCILLATOR WITH ENHANCED MODE ROBUSTNESS," filed Sep. 17, 2021, each of which is incorporated by reference in its entirety for all purposes.

BACKGROUND

The present disclosure relates generally to wireless communication, and more specifically to improving performance in wireless communication.

In an electronic device, a transceiver may be coupled to one or more antennas to enable the electronic device to both transmit and receive wireless signals. The transceiver may include a local oscillator having voltage-controlled oscillation circuitry that generates a local oscillation signal. The local oscillation signal may be mixed with a data signal to upconvert the data signal (e.g., to a higher or radio frequency) to generate a transmission signal to be transmitted via the one or more antennas, or downconvert a received signal (e.g., to a lower or baseband frequency) received via the one or more antennas to generate a data signal.

In some cases, the voltage-controlled oscillation circuitry may include multiple cores (e.g., each core coupled to a respective inductor and providing respective terminals for signals output from a respective core), and operate in multiple modes to generate signals having different frequencies. However, in some cases, when the voltage-controlled oscillation circuitry is operating in a desired mode, another undesired mode may dominate the desired mode, resulting in the voltage-controlled oscillation circuitry outputting a signal with an undesired frequency and/or undesired phase noise.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, voltage-controlled oscillator circuitry includes a first core having a first inductor, a first positive terminal, and a first negative terminal. The voltage-controlled oscillator circuitry also includes a second core having a second inductor, a second positive terminal, and a second negative terminal. The voltage-controlled oscillator circuitry further includes a first mode booster coupling the first positive terminal of the first core to the second positive terminal of the second core, a second mode booster coupling the first negative terminal of the first core to the second positive terminal of the second core, a third mode booster coupling the first positive terminal of the first core to the second negative terminal of the second core, and a fourth mode booster coupling the first negative terminal of the first core to the second negative terminal of the second core.

In another embodiment, a method includes receiving, at processing circuitry, an indication to enter an operation mode of voltage-controlled oscillation circuitry having multiple cores and multiple gain boosters coupled between the cores. The method also includes enabling, via the processing circuitry, a first set of gain boosters disposed between the cores based on the operation mode. Further, the method includes disabling, via the processing circuitry, a second set of gain boosters disposed between the cores based on the operation mode.

In yet another embodiment, an electronic device includes a transceiver having voltage-controlled oscillator circuitry including multiple cores and multiple mode boosters coupled between the cores. The electronic device also includes processing circuitry that operates the mode boosters to increase a desired gain of a desired operating mode of the cores and decrease an undesired gain of undesired operating modes of the cores.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
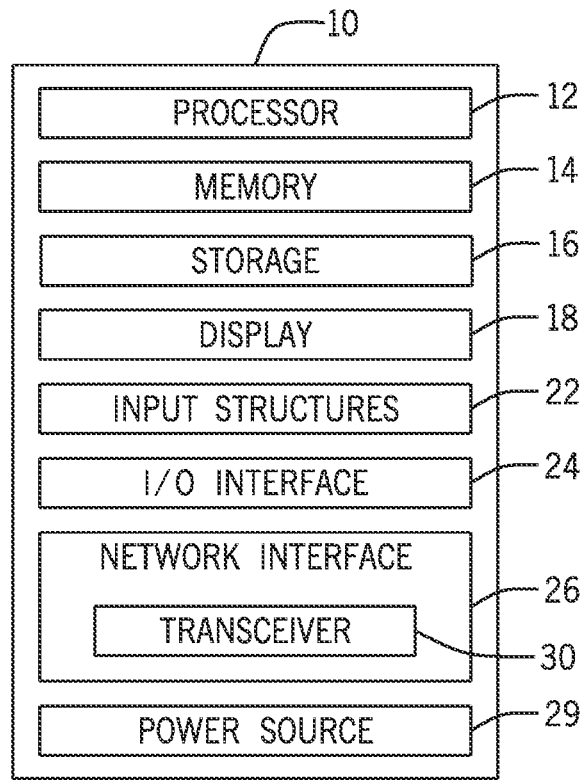
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

Decreasing or minimizing phase noise in wireless signals transmitted or received by a wireless communication device may result in lower data error vector magnitude, improved spectral purity, and, ultimately, superior performance. As implementation of resonators with on-chip inductors and capacitors may be constrained by quality factor on lossy silicon substrates, multi-core architecture becomes a promising approach, particularly for $5^{th}$ generation (5G) millimeter wave (mmWave) applications. Theoretically, phase noise may be reduced by a factor of $10*\log_{10}(N)$ with N coupled oscillators.

In particular, the wireless communication device may include a transceiver coupled to one or more antennas that enables the device to transmit and receive the wireless signals. The transceiver may include a local oscillator having voltage-controlled oscillation circuitry that generates a local oscillation signal. The local oscillation signal may be mixed with a data signal to upconvert the data signal (e.g., to a higher or radio frequency) to generate a transmission signal to be transmitted via the one or more antennas, or downconvert a received signal (e.g., to a lower or baseband frequency) received via the one or more antennas to generate a data signal.

The voltage-controlled oscillation circuitry may include multiple cores (e.g., each core having its own LC tank circuit), and operate in multiple modes to generate signals having different frequencies, thus enlarging tuning range. For different operation modes, an oscillator is coupled to different load capacitances so the oscillation frequency may be varied over the modes. However, when the voltage-controlled oscillation circuitry is operating in a desired mode, another undesired mode may surpass and even dominate the desired mode. This may be because the undesired mode has greater gain (e.g., a larger loop gain) than that of the desired mode, which causes the undesired mode to increase more rapidly than the desired mode. "Loop gain" may refer to a total gain of or around a feedback loop, which may feed an output back into an input, be measured in decibels, and indicate startup strength in a positive feedback-based oscillator. Indeed, this may be dependent upon an initial condition of system dynamics and/or external disturbances to the voltage-controlled oscillation circuitry. As a result of this dominant undesired mode of operation, the voltage-controlled oscillation circuitry may output a signal with an undesired frequency and/or undesired phase noise.

With this in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 802.11x family of protocols (e.g., WI-FTC)), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
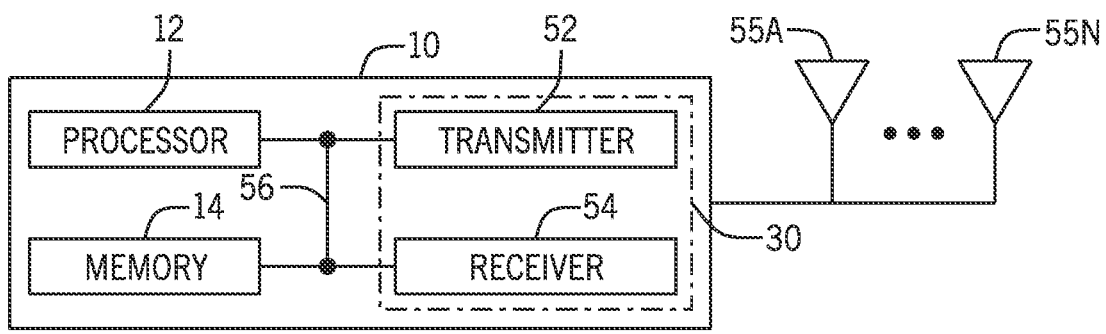
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
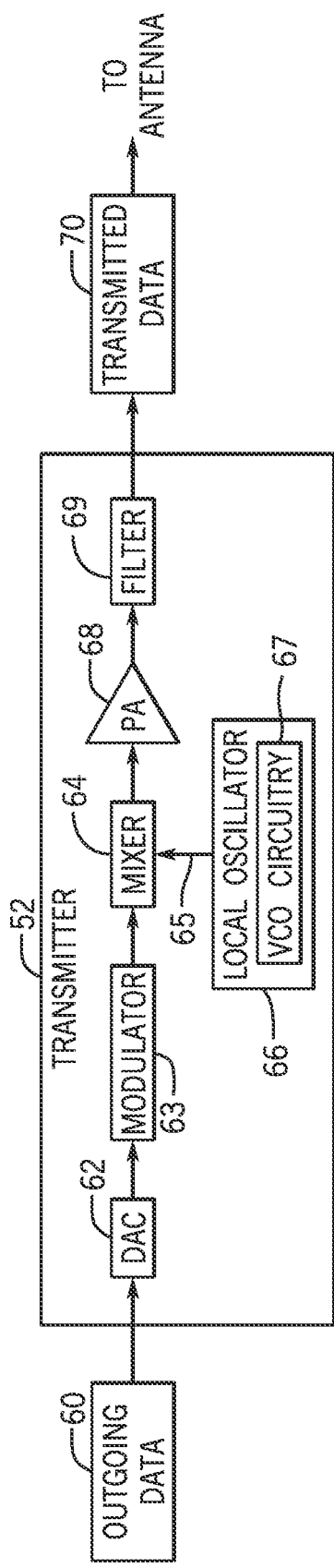
FIG. 3 is a schematic diagram of a transmitter of the electronic device of FIG. 1, according to embodiments of the present disclosure.

FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 from a local oscillator 66 to generate a radio frequency signal. In particular, the local oscillator 66 may include voltage-controlled oscillation (VCO) circuitry 67 that generates or facilitates generating the local oscillation signal 65.

A power amplifier (PA) 68 receives the radio frequency signal from the mixer 64, and may amplify the modulated signal to a suitable level to drive transmission of the signal via the one or more antennas 55. A filter 69 (e.g., filter circuitry and/or software) of the transmitter 52 may then remove undesirable noise from the amplified signal to generate transmitted data 70 to be transmitted via the one or more antennas 55. The filter 69 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 69 if the power amplifier 68 outputs the amplified signal in or approximately in a desired frequency range (such that filtering of the amplified signal may be unnecessary).

Figure 4:
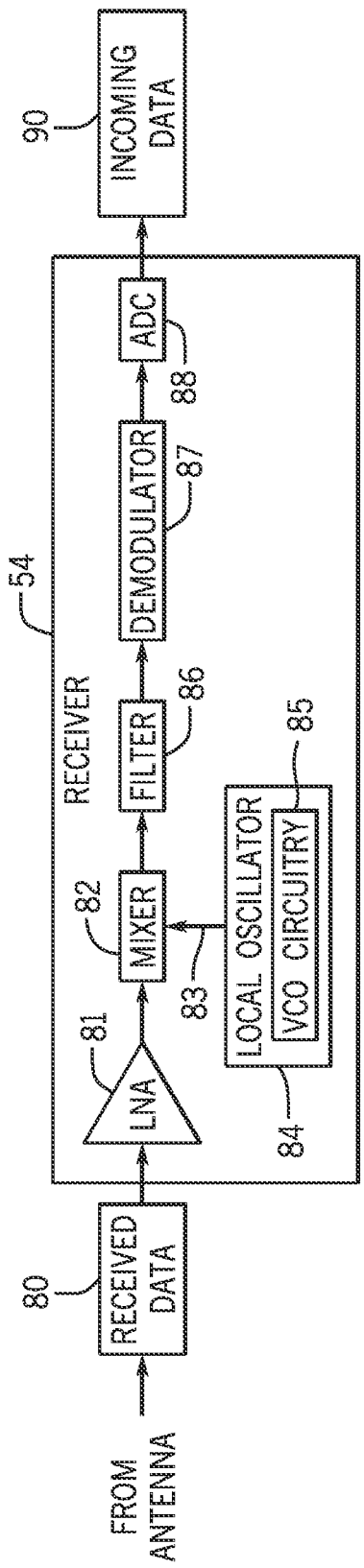
FIG. 4 is a schematic diagram of a receiver of the electronic device of FIG. 1, according to embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillation signal 83 from a local oscillator 84 to generate an intermediate or baseband frequency signal. Like the local oscillator 66 of the transmitter 52, the local oscillator 84 of the receiver 54 may include VCO circuitry 85 that generates or facilitates generating the local oscillation signal 83. A filter 86 (e.g., filter circuitry and/or software) may remove undesired noise from the signal, such as cross-channel interference. The filter 86 may also remove additional signals received by the one or more antennas 55 that are at frequencies other than the desired signal. The filter 86 may include any suitable filter or filters to remove the undesired noise or signals from the received signal, such as a bandpass filter, a bandstop filter, a low pass filter, a high pass filter, and/or a decimation filter. A demodulator 87 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Figure 5:
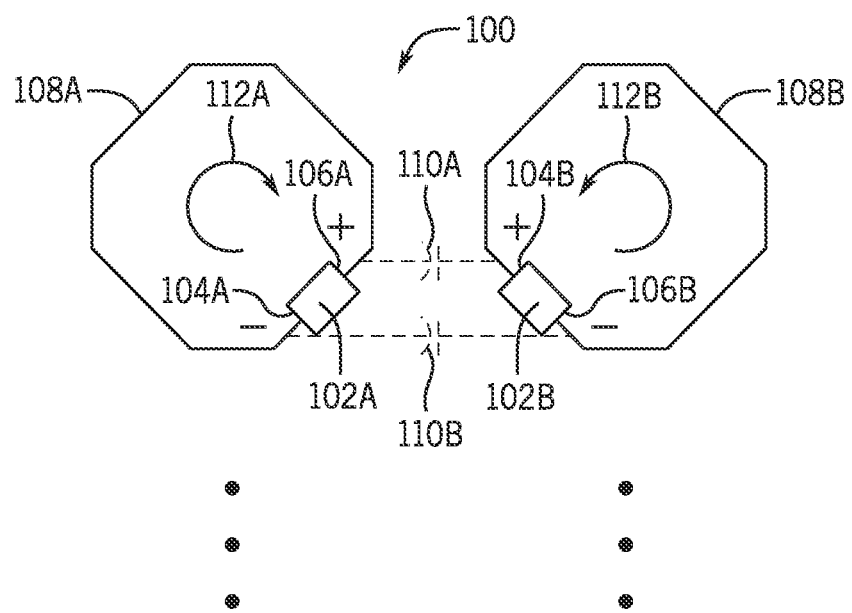
FIG. 5 is a schematic diagram of a portion of voltage-controlled oscillation (VCO) circuitry of the electronic device of FIG. 1 with two cores operating in phase, according to embodiments of the present disclosure.

FIG. 5 is a schematic diagram of a portion 100 of the VCO circuitry 67, 85 that may be part of the transceiver 30, according to embodiments of the present disclosure. The VCO circuitry may have multiple cores 102A, 102B (collectively 102). While two cores 102A, 102B are illustrated in FIG. 5, but it should be understood that the VCO circuitry 67, 85 may include any suitable number of cores 102, such as three or more cores 102, four or more cores 102, eight or more cores 102, and so on. Each core 102A, 102B may include a first terminal 104A, 104B and a second terminal 106A, 106B that may provide tap points for outputting signals from the core 102A, 102B. In particular, the first terminals 104A, 104B (collectively 104) and the second terminals 106A, 106B (collectively 106) may enable outputting a differential signal pair. As illustrated, each core 102A, 102B is also coupled to a respective inductor 108A, 108B (collectively 108). Additionally, the two cores 102 may be coupled via one or more capacitances 110A, 110B (collectively 110), illustrated in FIG. 5 as a capacitor pair. It should be understood that the capacitances 110 may be provided by any suitable device or component, such as one or more capacitors.

As illustrated, a first current 112A in the inductor 108A of a first core 102A has a clockwise current direction and may have a phase of 0°, and a second current 112B in the inductor 108B of a second core 102B has a counterclockwise current direction may have a phase of 180°. As such, the first terminal 104A of the inductor 108A is negative (indicated as "−") and the second terminal 104A of the inductor 108A is positive (indicated as "+"). Similarly, the first terminal 104B of the inductor 108B is positive, and the second terminal 106B of the inductor 108B is negative. Accordingly, tank voltages (e.g., voltages at the cores 102A, 102B) are in phase. That is, for two adjacent oscillator cores (e.g., cores 102A, 102B), the tank voltages are in phase if the inductor currents 112A, 112B have opposite current directions, and are out of phase if the inductor currents 112A, 112B have the same current direction. When the adjacent cores 102A, 102B are in phase (e.g., have a same phase or have a phase difference of 0°), the capacitances 110 may provide a lower capacitance (e.g., than when the adjacent cores 102A, 102B are out of phase), such as a decreased or minimum (e.g., zero or near zero) capacitance and appear "invisible," thus acting as a short circuit between the cores 102A, 102B. As such, the capacitances 110 are illustrated with dashed instead of solid lines. Moreover, when the adjacent cores 102A, 102B are in phase, tank impedances (e.g., impedances at the cores 102A, 102B) may have greater impedances (e.g., than when the adjacent cores 102A, 102B are out of phase), such as increased or maximum impedances. This mode of operation may be referred to herein as a first mode or "Mode 0."

On the other hand, when the adjacent cores 102A, 102B are out of phase, the capacitances 110 may provide a greater capacitance between the cores 102A, 102B. In particular, the more out of phase the adjacent cores 102A, 102B are (e.g., the greater the phase difference between the cores 102A, 102B), the greater capacitance may be provided by the capacitances 110. As such, the capacitances 110 may have an increased or maximum capacitance when the adjacent cores 102A, 102B are out of phase by 180°.

Figure 6:
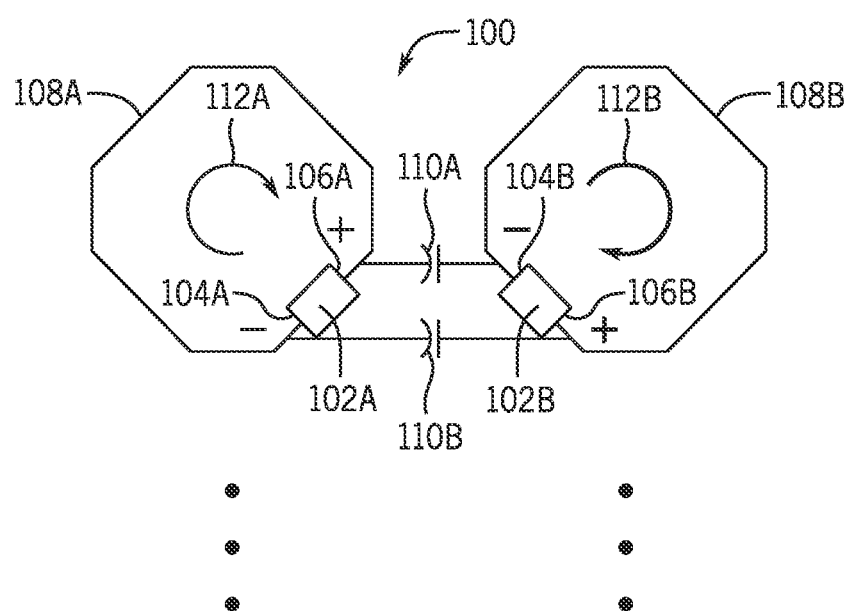
FIG. 6 is a schematic diagram of the portion of the VCO circuitry of FIG. 5 with the two cores operating out of phase, according to embodiments of the current disclosure.

FIG. 6 is a schematic diagram of the portion 100 of the VCO circuitry 67, 85 with the two cores 102 operating out of phase, according to embodiments of the current disclosure. In particular, the currents 112 in the inductors 108 of the cores 102 have the same (e.g., clockwise) direction. As with the portion 100 of the VCO circuitry 67, 85 of FIG. 5, the first terminal 104A of the inductor 108A is negative and the second terminal 104A of the inductor 108A is positive. However, the first terminal 104B of the inductor 108B is negative, and the second terminal 106B of the inductor 108B is positive. Accordingly, the tank voltages are out of phase, and the capacitances 110 provide a larger (e.g., maximum) capacitance between the cores 102 and appear "visible." Thus, the capacitances 110 are drawn in solidly. Moreover, when the adjacent cores 102A, 102B are out of phase, the tank impedances may have lower impedances (e.g., than when the adjacent cores 102A, 102B are in phase), such as decreased or minimum (e.g., zero or near zero) impedances.

This operation may be referred to herein as a second mode or "Mode 1." However, because Mode 1 has a large capacitance and smaller tank impedance, and hence a smaller loop gain, it may be overwhelmed by Mode 0 (which has a smaller capacitance and larger tank impedance, and hence a larger loop gain).

To improve mode robustness that facilitates ensuring a definite oscillation state of a desired mode regardless of disturbance or initial condition (e.g., a state that is not dominated or overtaken by an undesired mode), the disclosed embodiments facilitate providing a desired mode loop gain that is larger than any other undesired mode during a stable oscillation phase. In this way, a correct or desired oscillation mode may be ensured, even if there is a disturbance from supply noise, a control voltage spike, and so on. In particular, the disclosed embodiments include one or more mode boosters coupled between oscillator cores 102 to selectively boost the desired mode gain and weaken undesired ones. In particular, mode boosters coupled to terminals (e.g., 104, 106) of the cores 102 that are associated with the desired operating mode may be enabled, while mode boosters coupled to terminals 104, 106 of the cores 102 that are associated with the undesired operating mode may be disabled, as explained in more detail below.

Figure 7:
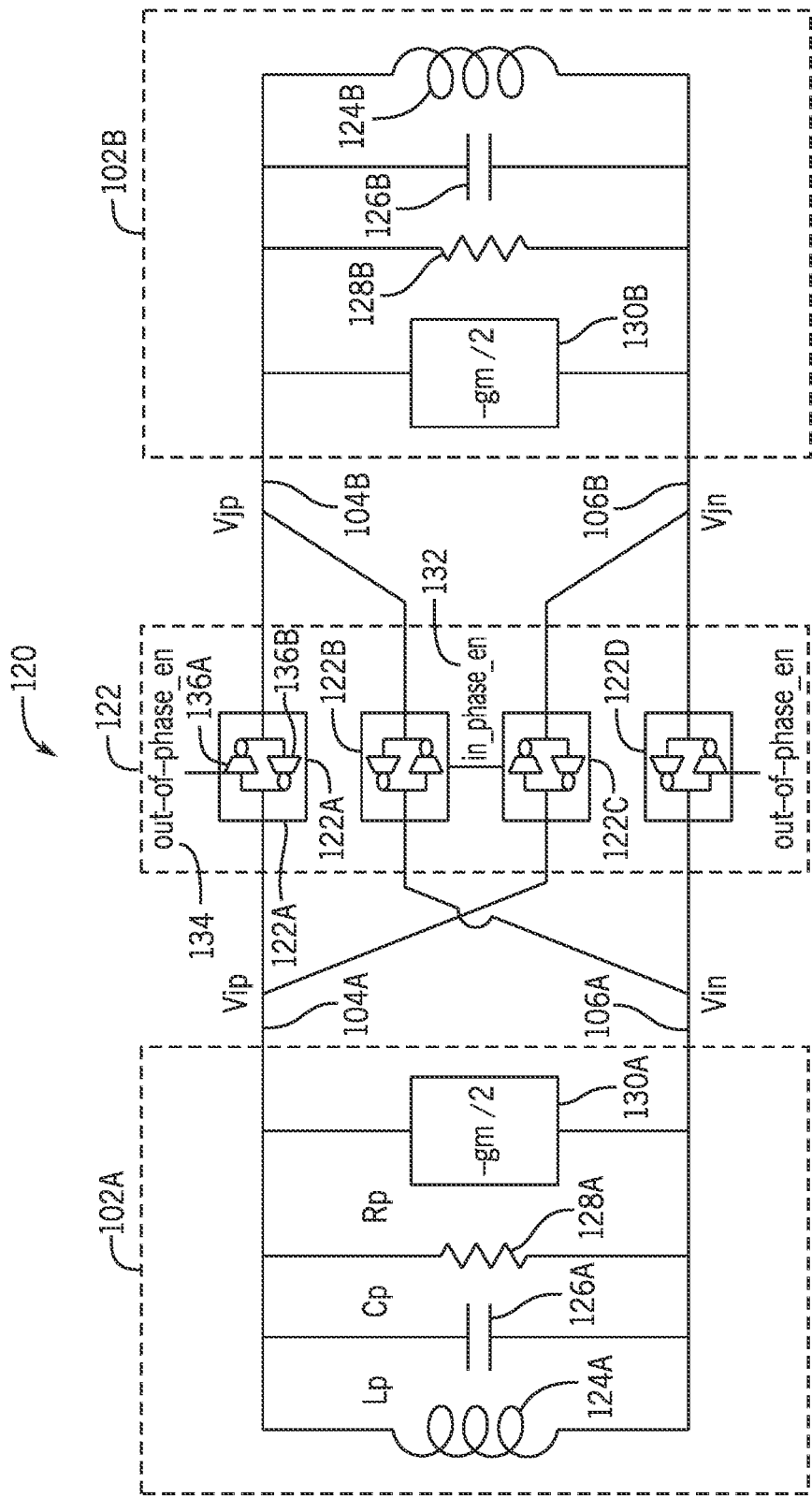
FIG. 7 is a circuit diagram of a portion of the VCO circuitry of the electronic device of FIG. 1 with mode boosters coupled between two cores, according to an embodiment of the present disclosure

FIG. 7 is a circuit diagram of a portion 120 of the VCO circuitry 67, 85 with mode boosters 122 coupled between two cores 102A, 102B, according to an embodiment of the present disclosure. As illustrated, across each tank of each core 102, an inductor or inductive component 124A, 124B ($L_p$), a capacitor or capacitive component 126A, 126B ($C_p$), a resistor or resistive or impedance component 128A, 128B ($R_p$), and a transistor or transconductive component 130A, 130B (−gm/2) are provided in parallel, respectively. Each terminal 104A, 106A of each core 102A is coupled to each terminal 104B, 106B of another core 102B via a mode or gain booster 122. The terminal 104, 106 of the cores 102 may be referred to herein as positive or negative terminals of the cores 102, though their polarities may be changed in additional or alternative embodiments. As illustrated, a positive terminal 104A of core 102A (with voltage $V_{ip}$) is coupled to a positive terminal 106A of core 102B (with voltage $V_{jp}$) via a first mode booster 122A. A negative terminal 106A of core 102A (with voltage $V_{in}$) is coupled to positive terminal 104B of core 102B via a second mode booster 122B. The positive terminal 104A of core 102A is coupled to a negative terminal 106B of core 102B (with voltage $V_{jn}$) via a third mode booster 122C. And the negative terminal 106A of core 102A is coupled to the negative terminal 106B of core 102B via a fourth mode booster 122D. It should be understood that certain components of the VCO circuitry 67, 85, such as switching circuitry, capacitors (e.g., as shown in FIGS. 5 and 6) coupled in parallel with the mode boosters 122, and so on, may be included in the VCO circuitry 67, 85, but may not be illustrated in FIG. 7 for convenience and ease of description.

The second and third mode boosters 122B, 122C may be enabled when the cores 102 are in phase (e.g., by setting an in-phase mode booster enable signal 132 (in_phase_en) to an enabling or high value), while the first and fourth mode boosters 122A, 122D may be disabled (e.g., by setting an out-of-phase mode booster enable signal 134 (out-of-phase_en) to a disabling or low value). On the other hand, the first and fourth mode boosters 122A, 122D may be enabled when the cores 102 are out of phase (e.g., by setting the enable signal out-of-phase_en 134 to the enabling or high value), while the second and third mode boosters 122B, 122C may be disabled (e.g., by setting the enable signal in_phase_en 132 to the disabling or low value). As illustrated, each mode booster 122 may include two transconductance cells 136A, 136B (collectively 136) coupled end-to-end, such that an output of a first transconductance cell 136A and an input of a second transconductance cell 136B are coupled to a first terminal of a first core (e.g., the positive terminal 104A of the core 102A), and an input of the first transconductance cell 136A and an output of the second transconductance cell 136B are coupled to a second terminal of a second core (e.g., the positive terminal 104A of the core 102A).

Figure 8:
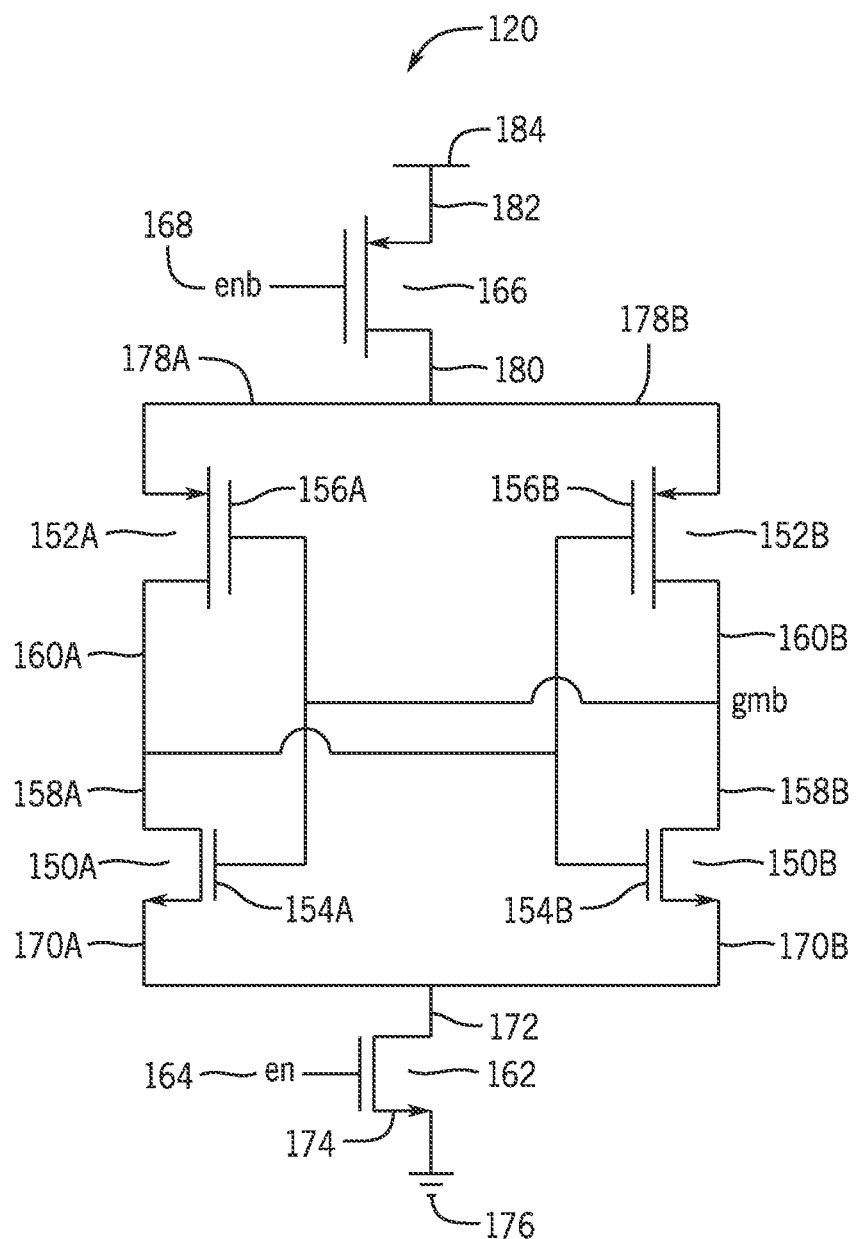
FIG. 8 illustrates a circuit diagram of a mode booster of FIG. 7, according to embodiments of the present disclosure.

FIG. 8 is a circuit diagram of the mode booster 122, according to embodiments of the present disclosure. As illustrated, the mode booster 122 may include two n-channel metal-oxide semiconductor (NMOS) transistors 150A, 150B and two p-channel metal-oxide semiconductor (PMOS) transistors 152A, 152B coupled as shown. In particular, a gate 154A of a first NMOS transistor 150A may be coupled to a gate 156A of a first PMOS transistor 152A, and a gate 154B of a second NMOS transistor 150B may be coupled to a gate 156B of a second PMOS transistor 152B. Further, a drain 158A of the first NMOS transistor 150A may be coupled to a drain 160A of the first PMOS transistor 152A, and a drain 158B of the second NMOS transistor 150B may be coupled to a drain 160B of the second PMOS transistor 152B.

The mode booster 122 may also include an NMOS transistor 162 (e.g., an enable NMOS transistor) that receives an enable en signal 164 to enable the mode booster 122, and a PMOS transistor 166 (e.g., a disable PMOS transistor) that receives an inverted enable enb signal 168 to disable the mode booster 122. As illustrated, sources 170A, 170B of the first and second NMOS transistors 150A, 150B may be coupled to a drain 172 of the enable NMOS transistor 162, and a source 174 of the enable NMOS transistor 162 may be coupled to ground 176. Additionally, sources 178A, 178B of the first and second PMOS transistors 152A, 152B may be coupled to a drain 180 of the disable PMOS transistor 166, and a source 182 of the disable PMOS transistor 166 may be coupled to a power source 184 (e.g., a supply power rail). However, it should be understood that the mode booster 122 may be implemented using all NMOS transistors, all PMOS transistors, any suitable combination of transistors, an operating transconductance amplifier, or any other suitable components.

While the mode boosters 122 of the present disclosure may be illustrated as being implemented using transconductance cells 136, it should be understood that the use of transconductance cells 136 is exemplary, and, in additional or alternative embodiments, the mode boosters 122 may include other implementations depending on VCO circuitry topologies and/or coupling mechanisms. FIGS. 9A-9D are circuit diagrams of additional or alternative embodiments of the mode booster 122 with different input/output implementations based on signal type (e.g., voltage versus current).

Figure 9A:
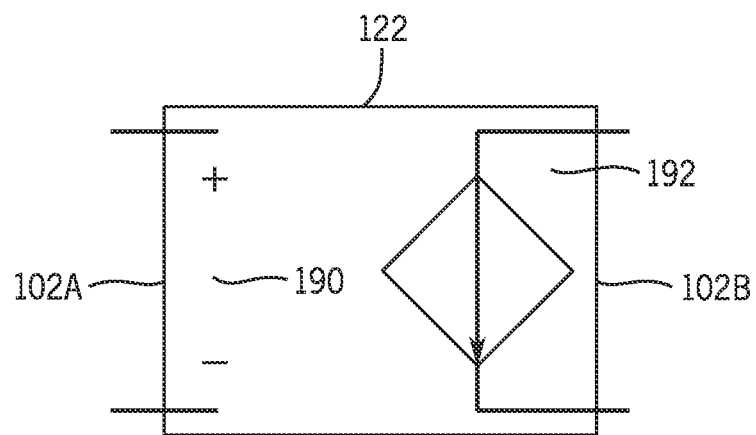
FIG. 9A is a circuit diagram of the mode booster of FIG. 8 in the form of a transconductance amplifier having a voltage input and a current output, according to embodiments of the present disclosure.

FIG. 9A is a circuit diagram of the mode booster 122 in the form of a transconductance amplifier having a voltage input 190 and a current output 192, according to embodiments of the present disclosure. As illustrated, the mode booster 122 couples a first core 102A to a second core 102B. The mode booster 122 may couple to the first core 102A via the voltage input 190, and couple to the second core 102B via the current output 192.

Figure 9B:
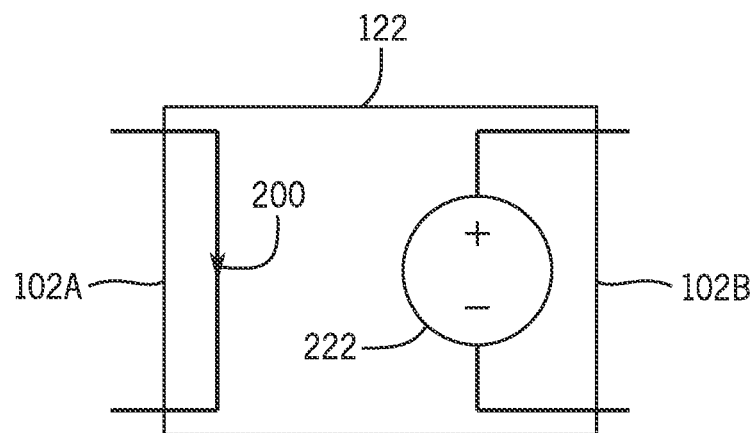
FIG. 9B is a circuit diagram of the mode booster of FIG. 8 in the form of a trans-impedance amplifier having a current input and a voltage output, according to embodiments of the present disclosure.

FIG. 9B is a circuit diagram of the mode booster 122 in the form of a trans-impedance amplifier having a current input 200 and a voltage output 202, according to embodiments of the present disclosure. As illustrated, the mode booster 122 couples a first core 102A to a second core 102B. The mode booster 122 may couple to the first core 102A via the current input 200, and couple to the second core 102B via the voltage output 202.

Figure 9C:
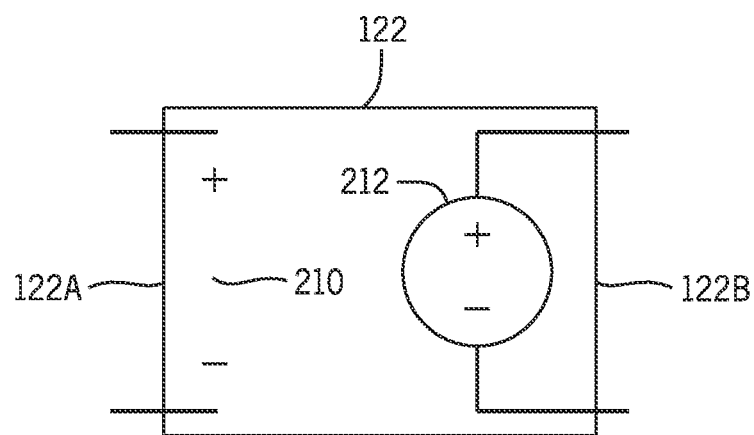
FIG. 9C is a circuit diagram of the mode booster of FIG. 8 in the form of a voltage amplifier having a voltage input and a voltage output, according to embodiments of the present disclosure.

FIG. 9C is a circuit diagram of the mode booster 122 in the form of a voltage amplifier having a voltage input 210 and a voltage output 212, according to embodiments of the present disclosure. As illustrated, the mode booster 122 couples a first core 102A to a second core 102B. The mode booster 122 may couple to the first core 102A via the voltage input 210, and couple to the second core 102B via the voltage output 212.

Figure 9D:
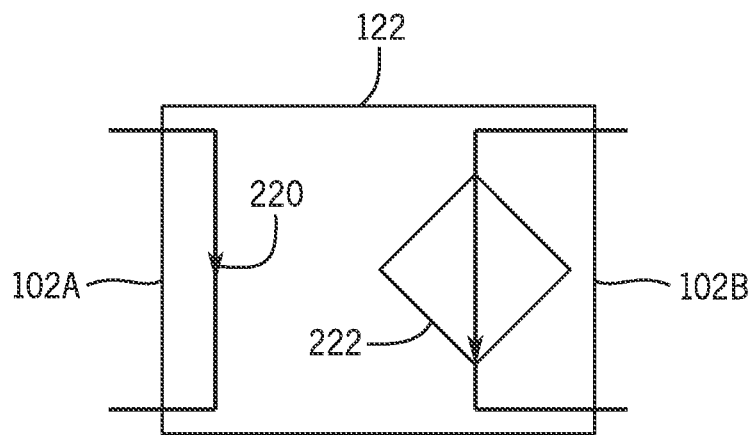
FIG. 9D is a circuit diagram of the mode booster of FIG. 8 in the form of a current amplifier having a current input and a current output, according to embodiments of the present disclosure.

FIG. 9D is a circuit diagram of the mode booster 122 in the form of a current amplifier having a current input 220 and a current output 222, according to embodiments of the present disclosure. As illustrated, the mode booster 122 couples a first core 102A to a second core 102B. The mode booster 122 may couple to the first core 102A via the current input 220, and couple to the second core 102B via the current output 222.

Figure 10:
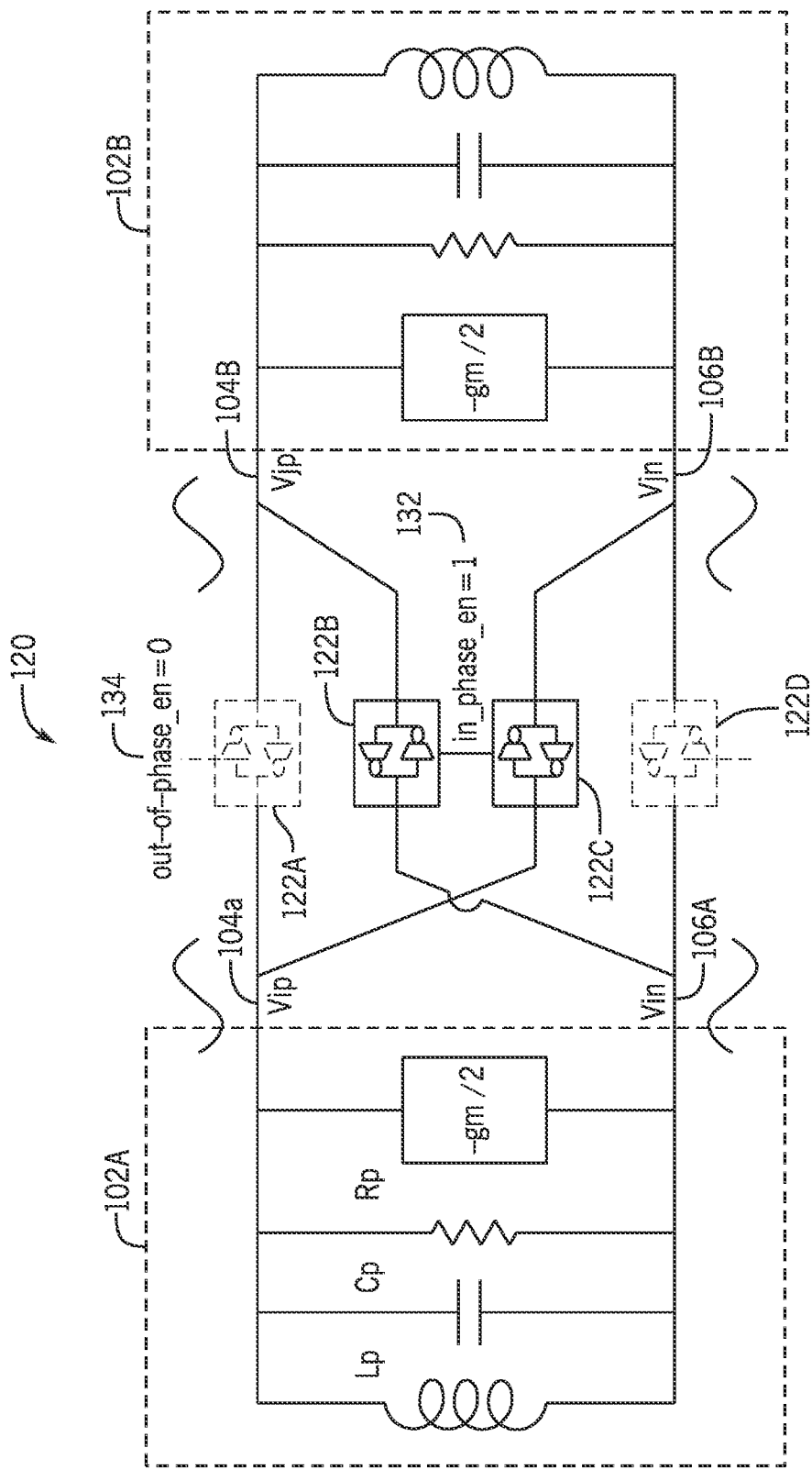
FIG. 10 is the portion of the VCO circuitry of FIG. 7 operating in an in-phase mode, according to embodiments of the present disclosure.

FIG. 10 is the portion 120 of the VCO circuitry 67, 85 operating in an in-phase mode, according to embodiments of the present disclosure. As such, the in-phase mode boosters 122B, 122C may be enabled by, for example, setting the in_phase_en signal 132 to a high value (e.g., 1). Additionally, the out-of-phase mode boosters 122A, 122D may be disabled (and thus drawn in dashed instead of solid lines) by, for example, setting the out-of-phase_en 134 signal to a low value (e.g., 0). It should be understood that the in_phase_en signal 132 may be set to any suitable value (e.g., a low value, an intermediate value) to enable the in-phase boosters 122B, 122C, and the out-of-phase_en 134 signal may be set to any suitable value (e.g., a high value, an intermediate value) to disable the out-of-phase boosters 122A, 122D. For illustrative purposes to show inversion of waveforms between positive and negative terminals, positive representations of waveforms are shown at the positive terminal 104A of core 102A (with voltage $V_{ip}$) and the positive terminal 104B of core 102B (with voltage $V_{jp}$), and negative representations of the waveforms are shown at the negative terminal 106A of core 102A (with voltage $V_{in}$) and the negative terminal 106B of core 102B (with voltage $V_{jn}$), due to the core j being in phase with the core i.

Figure 11:
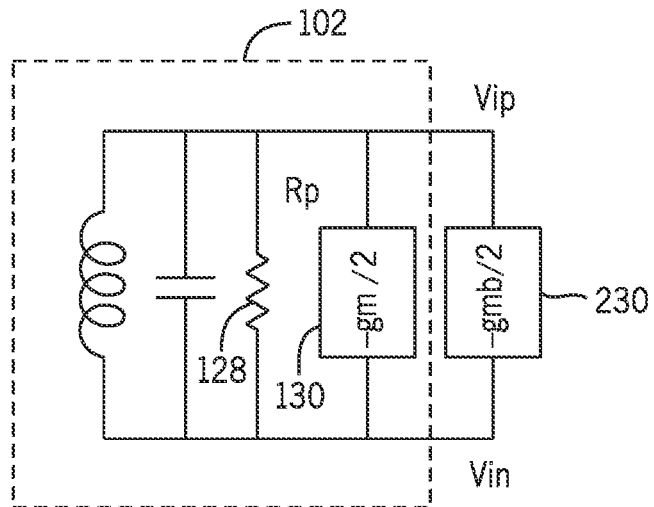
FIG. 11 is an equivalent half circuit model showing a startup gain of a desired in-phase mode of a core of the VCO circuitry of FIG. 10 when operating in the in-phase mode, according to embodiments of the present disclosure.

FIG. 11 is an equivalent half circuit model 230 showing a startup gain of a desired in-phase mode of a core 102 of the VCO circuitry 67, 85 when operating in the in-phase mode (e.g., as shown by the portion 120 of the VCO circuitry 67, 85 in FIG. 10), according to embodiments of the present disclosure. A transconductance of an oscillator core negative gm circuit of the portion 120 of the VCO circuitry 67, 85 shown in FIG. 7 is denoted as gm, and, as such, the transconductive component 130 of the core 102 in the equivalent half circuit model may be −gm/2. A transconductance of a mode booster 122 is denoted as $gm_b$, and, as such, the transconductive component 232 of the mode booster 122 in the equivalent half circuit model may be −$gm_b$/2. A shunt resistor or shunt resistive component 128 across a tank of the portion 120 of the VCO circuitry 67, 85 shown in FIG. 7 is denoted as $R_p$. A startup loop gain for the desired in-phase mode ($G_{inphase}$) may be expressed by Equation 1 below:

$$G_{inphase} = \left(\frac{gm}{2} + \frac{gm_b}{2}\right) \times R_p \qquad \text{(Equation 1)}$$

Figure 12:
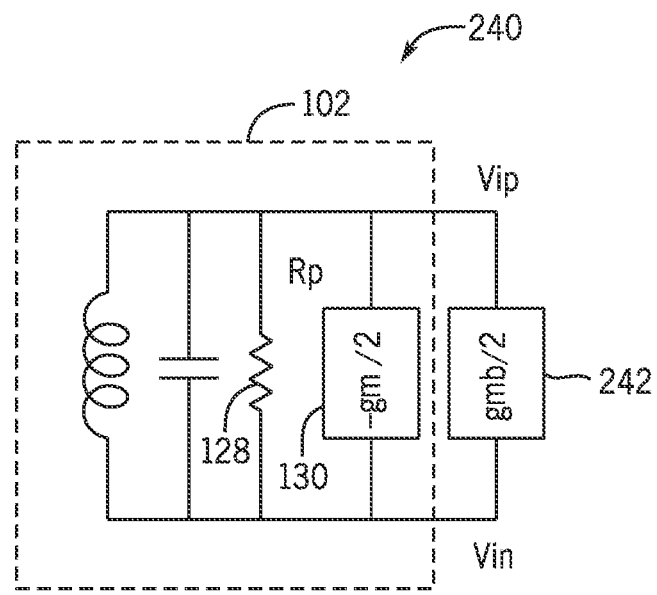
FIG. 12 is an equivalent half circuit model showing a startup gain of an undesired out-of-phase mode of a core of the VCO circuitry of FIG. 10 when operating in the in-phase mode, according to embodiments of the present disclosure.

FIG. 12 is an equivalent half circuit model 240 showing a startup gain of an undesired out-of-phase mode of a core 102 of the VCO circuitry 67, 85 when operating in the in-phase mode (e.g., as shown by the portion 120 of the VCO circuitry 67, 85 in FIG. 10), according to embodiments of the present disclosure. As with the equivalent half circuit model 230 showing the startup gain of the desired in-phase mode of FIG. 11, the transconductive component 130 of the core 102 in the equivalent half circuit model may be −gm/2, and the shunt resistive component 128 across a tank of the portion 120 of the VCO circuitry 67, 85 shown in FIG. 7 is denoted as $R_p$. However, the transconductive component 242 of the mode booster 122 in the equivalent half circuit model may be +$gm_b$/2. As such, the startup loop gain for the undesired out-of-phase mode ($G_{outphase}$) when operating in the in-phase mode may be expressed by Equation 2 below:

$$G_{outphase} = \frac{gm}{2} \times \frac{R_p}{1 + \frac{gm_b}{2} \times R_p}$$  (Equation 2)

Thus, the start-up gain of the desired in-phase mode may be boosted by a factor of (1+$gm_b$/gm) as shown in Equation 1, while the undesired out-of-phase mode gain may be weakened or decreased by a factor of (1+$gm_b R_p$/2) as shown in Equation 2. As such, the desired in-phase mode may have a more rapid increase in gain than that of the undesired out-of-phase mode, ensuring that the desired in-phase mode becomes and stays dominant over the undesired out-of-phase mode.

Figure 13:
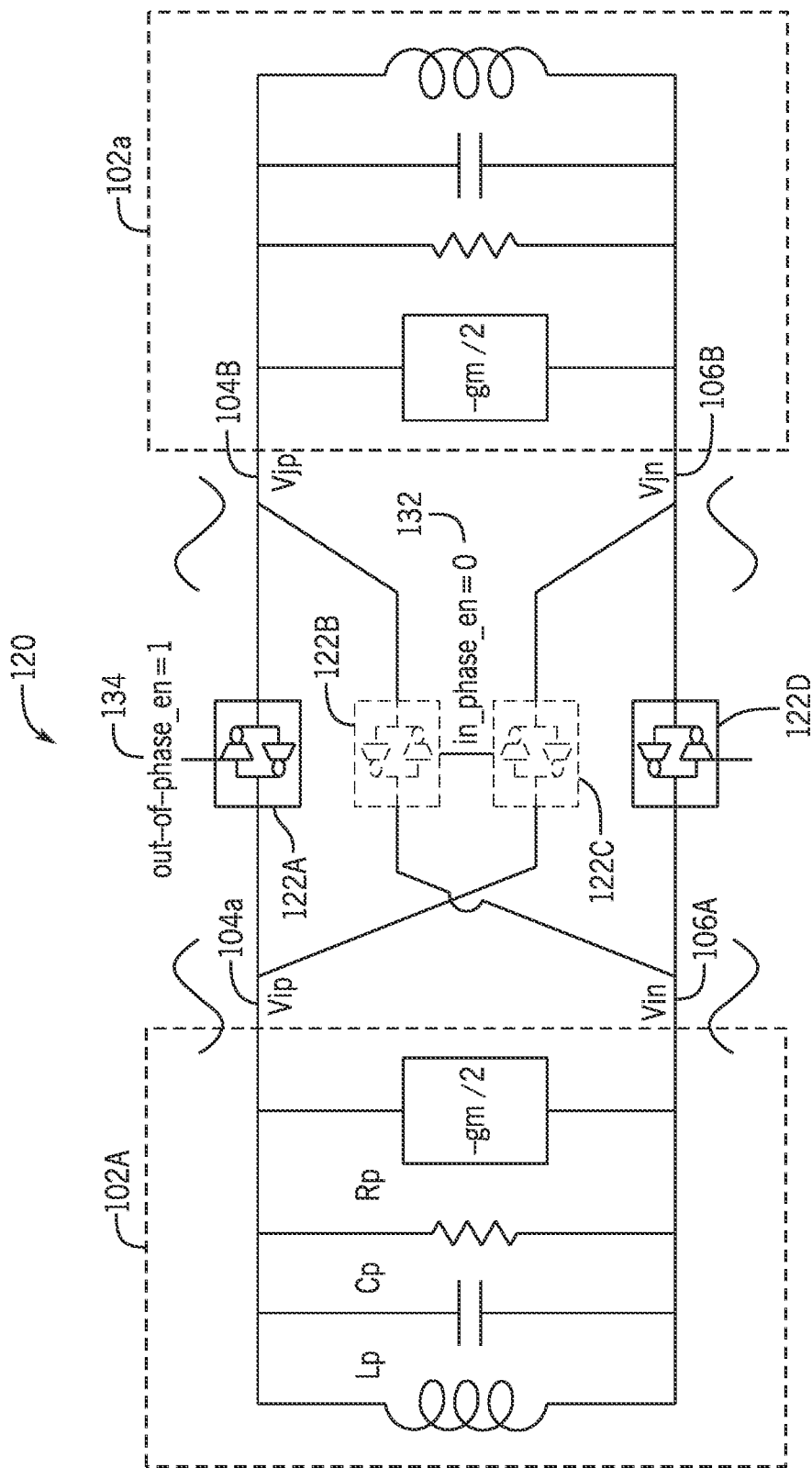
FIG. 13 is the portion of the VCO circuitry of FIG. 7 operating in an out-of-phase mode, according to embodiments of the present disclosure.

When operating the VCO circuitry 67, 85 in the out-of-phase mode, the enabled mode boosters 122B, 122C in FIG. 10 may be disabled, and the disabled mode boosters 122A, 122D in FIG. 10 may be enabled. As a result, Equation 1 above may apply for a startup loop gain for a desired out-of-phase mode ($G_{outphase}$), and Equation 2 above may apply for a startup loop gain for an undesired in-phase mode ($G_{inphase}$). FIG. 13 is the portion 120 of the VCO circuitry 67, 85 in-phase operating in an out-of-phase mode, according to embodiments of the present disclosure. The in-phase boosters 122B, 122C may be disabled (and thus drawn in dashed instead of solid lines) by, for example, setting the in_phase_en signal 132 to a low value (e.g., 0). Additionally, the out-of-phase boosters 122A, 122B may be enabled by, for example, setting the out-of-phase_en signal 134 to a high value. Positive representations of waveforms are shown at the positive terminal of a core i (with voltage $V_{ip}$) and the negative terminal of a core j (with voltage $V_{jn}$), and negative representations of waveforms are shown at the negative terminal of the core i (with voltage $V_{in}$) and the positive terminal of the core j (with voltage $V_{jp}$), due to the core j being out of phase with the core i. It should be understood that the in_phase_en signal 132 may be set to any suitable value (e.g., a high value, an intermediate value) to disable the in-phase boosters 122B, 122C, and the out-of-phase_en 134 signal may be set to any suitable value (e.g., a low value, an intermediate value) to enable the out-of-phase boosters 122A, 122D. For illustrative purposes to show inversion of waveforms between positive and negative terminals, positive representations of waveforms are shown at the positive terminal 104A of core 102A (with voltage $V_{ip}$) and the positive terminal 104B of core 102B (with voltage $V_{jp}$), and negative representations of the waveforms are shown at the negative terminal 106A of core 102A (with voltage $V_{in}$) and the negative terminal 106B of core 102B (with voltage $V_{jn}$).

The equivalent half circuit model showing a startup gain of a desired out-of-phase mode of a core 102 of the VCO circuitry 67, 85 when operating in the out-of-phase mode (e.g., as shown by the portion 120 of the VCO circuitry 67, 85 in FIG. 13) is also shown in FIG. 11. That is, the transconductive component 130 of the core 102 in the equivalent half circuit model may be −gm/2, the transconductive component 232 of the mode booster 122 in the equivalent half circuit model may be −$gm_b$/2, and the shunt resistive component 128 across a tank of the portion 120 of the VCO circuitry 67, 85 shown in FIG. 7 is denoted as $R_p$. The startup loop gain for the desired out-of-phase mode ($G_{outphase}$) may be expressed by Equation 3 below:

$$G_{outphase} = \left(\frac{gm}{2} + \frac{gm_b}{2}\right) \times R_p$$  (Equation 3)

The equivalent half circuit model for showing a startup gain of an undesired in-phase mode of a core 102 of the VCO circuitry 67, 85 when operating in the out-of-phase mode (e.g., as shown by the portion 120 of the VCO circuitry 67, 85 in FIG. 13) is also shown in FIG. 12.

FIG. 12 is an equivalent half circuit model 240 showing a startup gain of an undesired out-of-phase mode of a core 102 of the VCO circuitry 67, 85 when operating in the in-phase mode (e.g., as shown by the portion 120 of the VCO circuitry 67, 85 in FIG. 10), according to embodiments of the present disclosure. As with the equivalent half circuit model 230 showing the startup gain of the desired in-phase mode of FIG. 11, the transconductive component 130 of the core 102 in the equivalent half circuit model may be −gm/2, and the shunt resistive component 128 across a tank of the portion 120 of the VCO circuitry 67, 85 shown in FIG. 7 is denoted as $R_p$. However, the transconductive component 242 of the mode booster 122 in the equivalent half circuit model may be +$gm_b$/2. As such, the startup loop gain for the undesired in-phase mode ($G_{inphase}$) when operating in the out-of-phase mode may be expressed by Equation 4 below:

$$G_{inphase} = \frac{gm}{2} \times \frac{R_p}{1 + \frac{gm_b}{2} \times R_p}$$  (Equation 4)

As with when the VCO circuitry 67, 85 is operating in the in-phase mode, the start-up gain of the desired out-of-phase mode is boosted by a factor of (1+$gm_b$/gm), while the start-up gain of the undesired in-phase mode is weakened or decreased by a factor of (1+$gm_b R_p$/2). As such, the desired out-of-phase mode may have a more rapid increase in gain than that of the undesired in-phase mode, ensuring that the desired out-of-phase mode becomes and stays dominant over the undesired in-phase mode.

Figure 14:
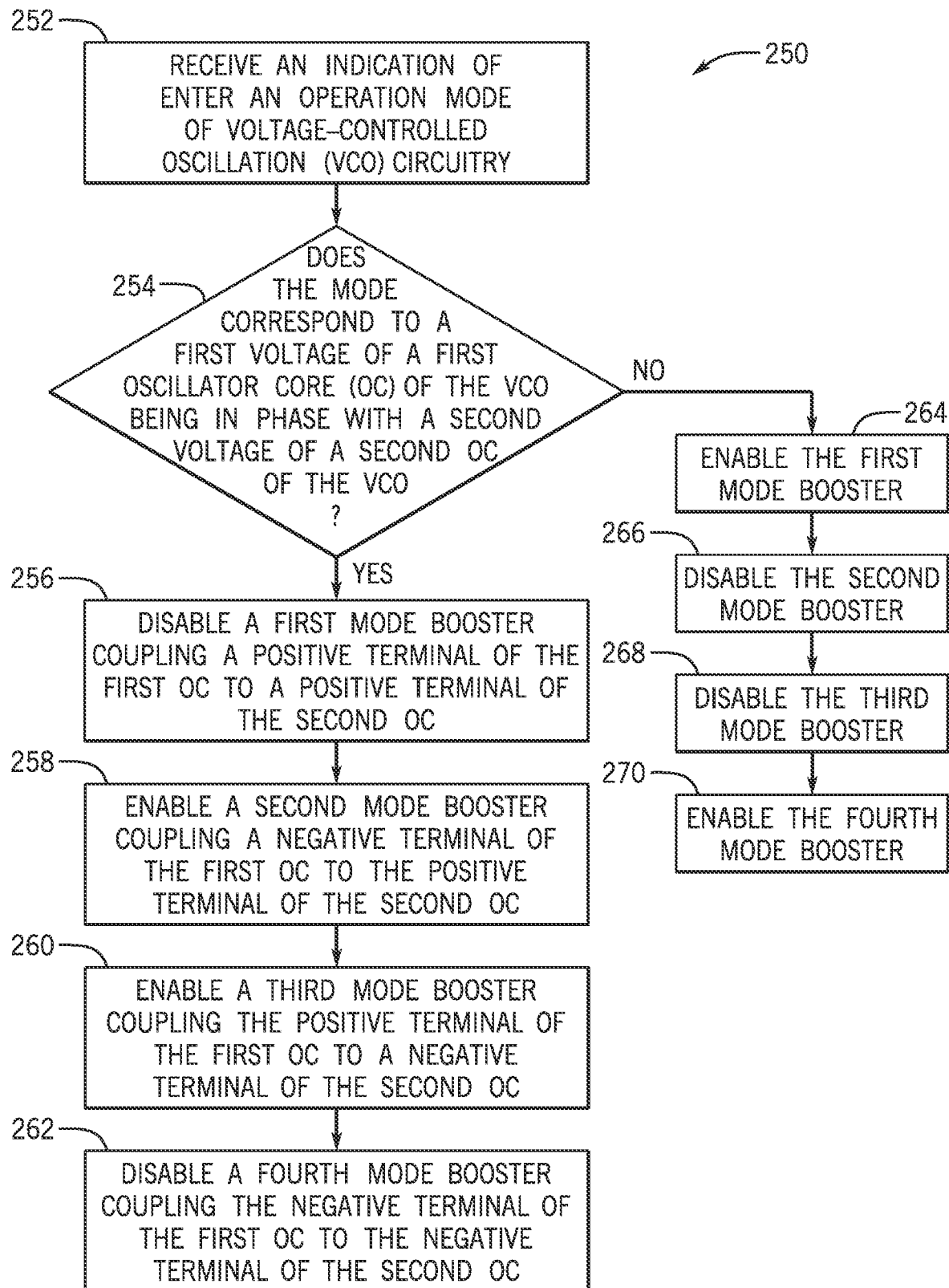
FIG. 14 is a flowchart of a method for increasing gain of a desired mode and decreasing gain of undesired modes, according to embodiment of the present disclosure.

FIG. 14 is a flowchart of a method 250 for increasing gain of a desired mode and decreasing gain of undesired modes, according to embodiment of the present disclosure. In particular, performing the method 250 of FIG. 14 may ensure that the desired mode of operation of the VCO circuitry 67, 85 remains dominant over undesired modes of operation. Any suitable device (e.g., a controller) that may control components of the electronic device 10, such as the processor 12, may perform the method 250. In some embodiments, the method 250 may be implemented by executing instructions stored in a tangible, non-transitory, computer-readable medium, such as the memory 14 or storage 16, using the processor 12. For example, the method 250 may be performed at least in part by one or more software components, such as an operating system of the electronic device 10, one or more software applications of the electronic device 10, and the like. While the method 250 is described using steps in a specific sequence, it should be understood that the present disclosure contemplates that the described steps may be performed in different sequences than the sequence illustrated, and certain described steps may be skipped or not performed altogether.

In process block 252, the processor 12 receives an indication to enter an operation mode of VCO circuitry 67, 85. In decision block 254, the processor 12 determines whether the mode corresponds to a first voltage of a first oscillator core (e.g., 102A) of the VCO circuitry 67, 85 being in phase with a second voltage of a second core 102B of the VCO circuitry 67, 85. That is, the processor 12 determines whether the mode corresponds to an in-phase mode, such as that depicted in FIG. 10.

If so, in process block 256, the processor 12 disables a first mode booster (e.g., 122A) coupling a positive terminal (e.g., 104A) of the first core 102A to a positive terminal (e.g., 104B) of the second core 102B. In particular, the processor 12 may set an out-of-phase mode booster enable signal 134 (out-of-phase_en) to a disabling or low value to indicate disabling out-of-phase mode boosters, including the first mode booster 122A, and/or send a disabling-valued out-of-phase_en 134 signal to the first mode booster 122A. In process block 258, the processor 12 also enables a second mode booster (e.g., 122B) coupling a negative terminal (e.g., 106A) of the first core 102A to the positive terminal 104B of the second core 102B. In particular, the processor 12 may set an in-phase mode booster enable signal 132 (in-phase_en) to an enabling or high value to indicate enabling in-phase mode boosters, including the second mode booster 122B, and/or send an enabling-valued in-phase_en 132 signal to the second mode booster 122B.

In process block 260, the processor 12 also enables a third mode booster (e.g., 122C) coupling the positive terminal 104A of the first core 102A to a negative terminal (e.g., 106B) of the second core 102B. In particular, the processor 12 may set the in-phase mode booster enable signal 132 (in-phase_en) to the enabling or high value to indicate enabling the in-phase mode boosters, including the third mode booster 122C, and/or send the enabling-valued in-phase_en 132 signal to the third mode booster 122C. In process block 262, the processor 12 disables a fourth mode booster (e.g., 122D) coupling the negative terminal 106A of the first core 102A to the negative terminal 106B of the second core 102B. In particular, the processor 12 may set the out-of-phase mode booster enable signal 134 (out-of-phase_en) to the disabling or low value to indicate disabling the out-of-phase mode boosters, including the fourth mode booster 122D, and/or send the disabling-valued out-of-phase_en 134 signal to the fourth mode booster 122D.

The VCO circuitry 67, 85 may now be configured to operate in an in-phase mode, such that the desired in-phase mode remains dominant over undesired modes of operation, including an undesired out-of-phase mode. In particular, a start-up gain of the desired in-phase mode may be boosted by a factor of $(1+gm_b/gm)$ (e.g., as shown in Equation 1 above), while the undesired out-of-phase mode gain may be weakened or decreased by a factor of $(1+gm_bR_p/2)$ (e.g., as shown in Equation 2 above). As such, the desired in-phase mode may have a more rapid increase in gain than that of the undesired out-of-phase mode, ensuring that the desired in-phase mode becomes and stays dominant over the undesired out-of-phase mode.

However, if, in decision block 254, the processor 12 determines that the mode does not correspond to the in-phase operating mode, then, in process block 264, the processor 12 enables the first mode booster 122A coupling the positive terminal 104A of the first core 102A to the positive terminal 104B of the second core 102A. In particular, the processor 12 may set the out-of-phase mode booster enable signal 134 (out-of-phase_en) to the enabling or high value to indicate enabling the out-of-phase mode boosters, including the first mode booster 122A, and/or send the enabling-valued out-of-phase_en 134 signal to the first mode booster 122A. In process block 266, the processor 12 also disables the second mode booster 122B coupling the negative terminal 106A of the first core 102A to the positive terminal 104B of the second core 102B. In particular, the processor 12 may set the in-phase mode booster enable signal 132 (in-phase_en) to the disabling or low value to indicate disabling the in-phase mode boosters, including the second mode booster 122B, and/or send the disabling-valued in-phase_en 132 signal to the second mode booster 122B.

In process block 268, the processor 12 also disables the third mode booster 122C coupling the positive terminal 104A of the first core 102A to the negative terminal 106B of the second core 102B. In particular, the processor 12 may set the in-phase mode booster enable signal 132 (in-phase_en) to the disabling or low value to indicate disabling the in-phase mode boosters, including the third mode booster 122C, and/or send the disabling-valued in-phase_en 132 signal to the third mode booster 122C. In process block 270, the processor 12 enables the fourth mode booster 122D coupling the negative terminal 106A of the first core 102A to the negative terminal 106B of the second core 102B. In particular, the processor 12 may set the out-of-phase mode booster enable signal 134 (out-of-phase_en) to the enabling or high value to indicate enabling the out-of-phase mode boosters, including the fourth mode booster 122D, and/or send the enabling-valued out-of-phase_en 134 signal to the fourth mode booster 122D.

The VCO circuitry 67, 85 may now be configured to operate in an out-of-phase mode, such that the desired out-of-phase mode remains dominant over undesired modes of operation, including an undesired in-phase mode. In particular, a start-up gain of the desired out-of-phase mode may be boosted by a factor of $(1+gm_b/gm)$ (e.g., as shown in Equation 3 above), while the undesired in-phase mode gain may be weakened or decreased by a factor of $(1+gm_bR_p/2)$ (e.g., as shown in Equation 4 above). As such, the desired out-of-phase mode may have a more rapid increase in gain than that of the undesired in-phase mode, ensuring that the desired out-of-phase mode becomes and stays dominant over the undesired in-phase mode. In this manner, the method 250 may increase gain of a desired mode and decrease or weaken gain of undesired modes. In particular, performing the method 250 of FIG. 14 may ensure that the desired mode of operation of the VCO circuitry 67, 85 remains dominant over undesired modes of operation.

Figure 15A:
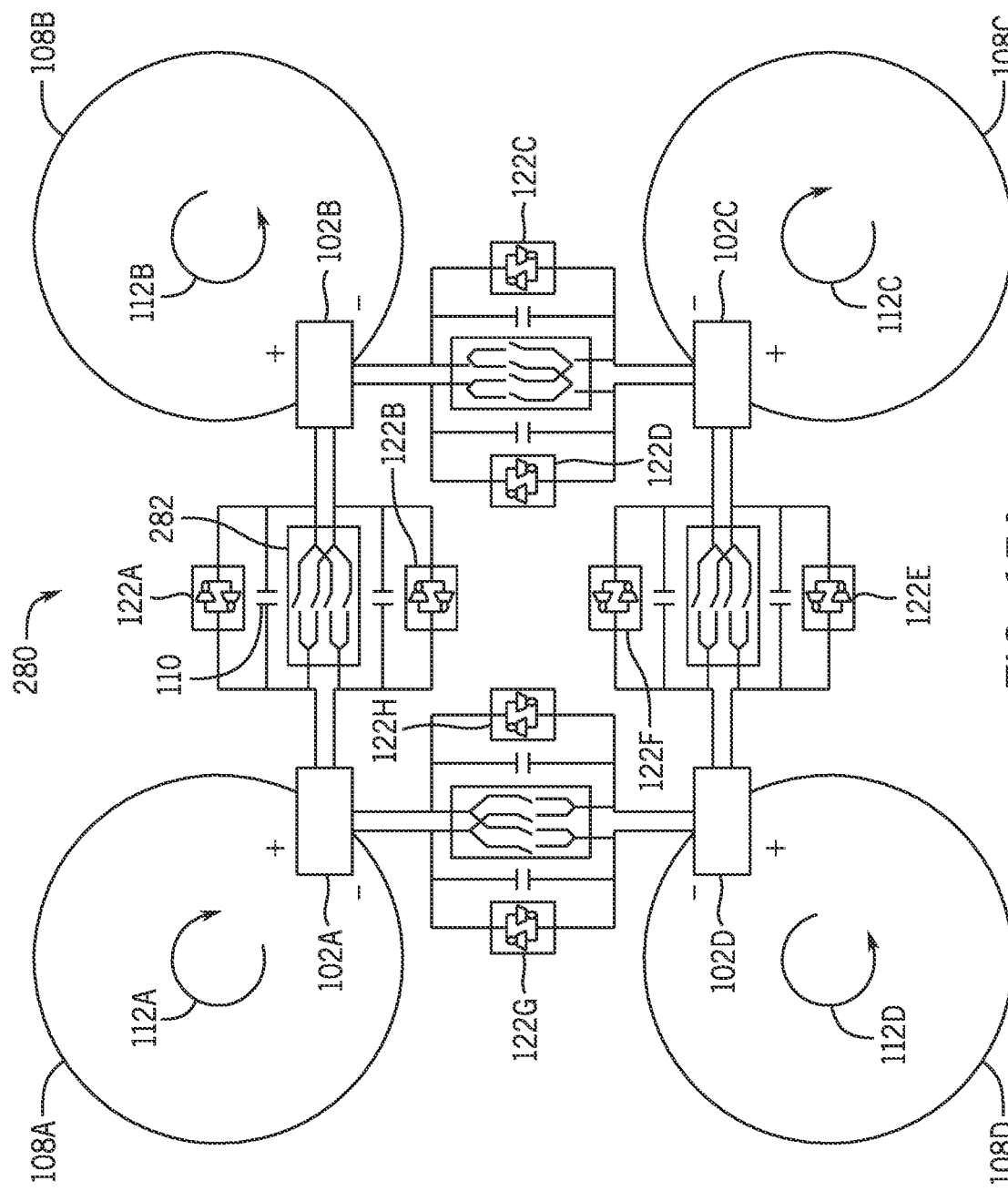
FIG. 15A is an example implementation of the VCO circuitry of the electronic device of FIG. 1 having four cores and the mode boosters described herein operating in a first mode (e.g., Mode 0), according to an embodiment of the present disclosure.

FIG. 15A is an example implementation 280 of VCO circuitry 67, 85 having four cores 102A-D and the mode boosters 122A-H (collectively) as described herein operating in a first mode (e.g., Mode 0), according to an embodiment of the present disclosure. Switching circuitry 282 and capacitances 110 are coupled in parallel with the mode boosters 122, and in turn couple the cores 102 together. In particular, the switching circuitry 282 may enable cores 102 to be selectively coupled together or uncoupled, and, as such, be part of or separate from the VCO circuitry 67, 85.

As illustrated, Mode 0 may include each current direction 112A-D (collectively 112) in each inductor 108A-D (collectively 108) of each core 102 having an opposite current direction when compared to that of its adjacent cores 102. As such, each core 102 may be in phase with its adjacent cores 102. That is, a current direction 112A (e.g., clockwise) of a first inductor 108A of a first core 102A may be opposite to that of current directions 112B, 112D (e.g., counterclockwise) of second and fourth inductors 108B, 108D of adjacent second and fourth cores 102B, 102D. Similarly, a current direction 112B (e.g., counterclockwise) of a second inductor 108B of a second core 102B may be opposite to that of current directions 112A, 112C (e.g., clockwise) of first and third inductors 108A, 108C of adjacent first and third cores 102A, 102C, and so on.

Figure 15B:
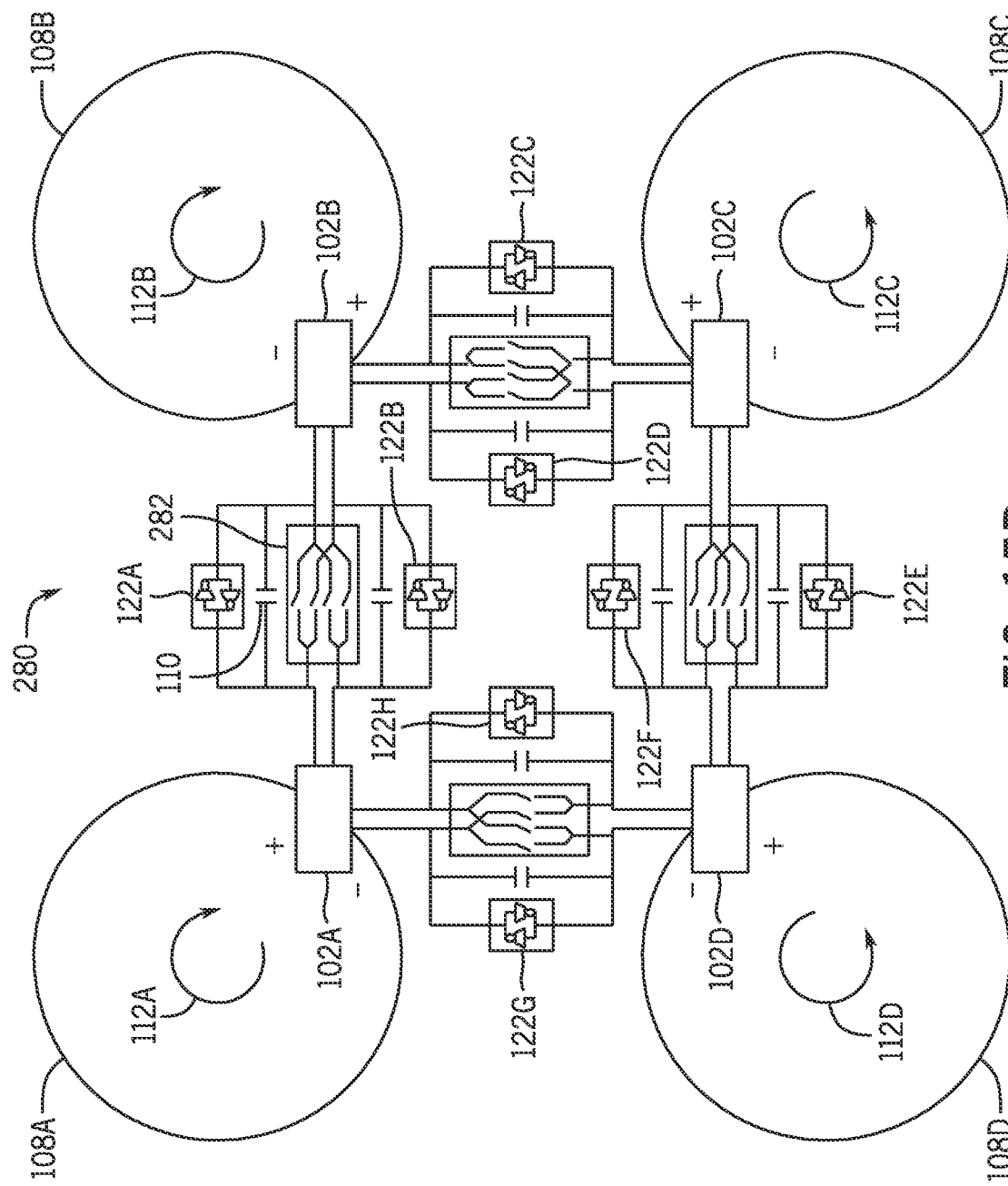
FIG. 15B is the example implementation of the VCO circuitry of FIG. 15A operating in a second mode (e.g., Mode 1), according to an embodiment of the present disclosure.

FIG. 15B is the example implementation 280 of VCO circuitry 67, 85 of FIG. 15A operating in a second mode (e.g., Mode 1), according to an embodiment of the present disclosure. As illustrated, Mode 1 may include current directions 112 in two inductors 108 of adjacent cores 102 having a first current direction (e.g., as such, the two adjacent cores 102 are out-of-phase), and current directions 112 in two other inductors 108 of two other adjacent cores 102 having a second current direction different from the first current direction (e.g., as such, the two other adjacent cores 102 are out-of-phase). That is, the current directions 112A, 112B (e.g., clockwise) of the first and second inductors 108A, 108B of the first and second cores 102A, 102B are the same, and the current directions 112C, 112D (e.g., counterclockwise) of the third and fourth inductors 108C, 108D of adjacent third and fourth cores 102C, 102D are the same, but different from the current directions 112A, 112B of the first and second inductors 108A, 108B of the first and second cores 102A, 102B. As such, the first core 102A is in phase with the fourth core 102D, the second core 102B is in phase with the third core 102C, but the first core 102A is out of phase with the second core 102B, and the third core 102C is out of phase with the fourth core 102D.

Figure 15C:
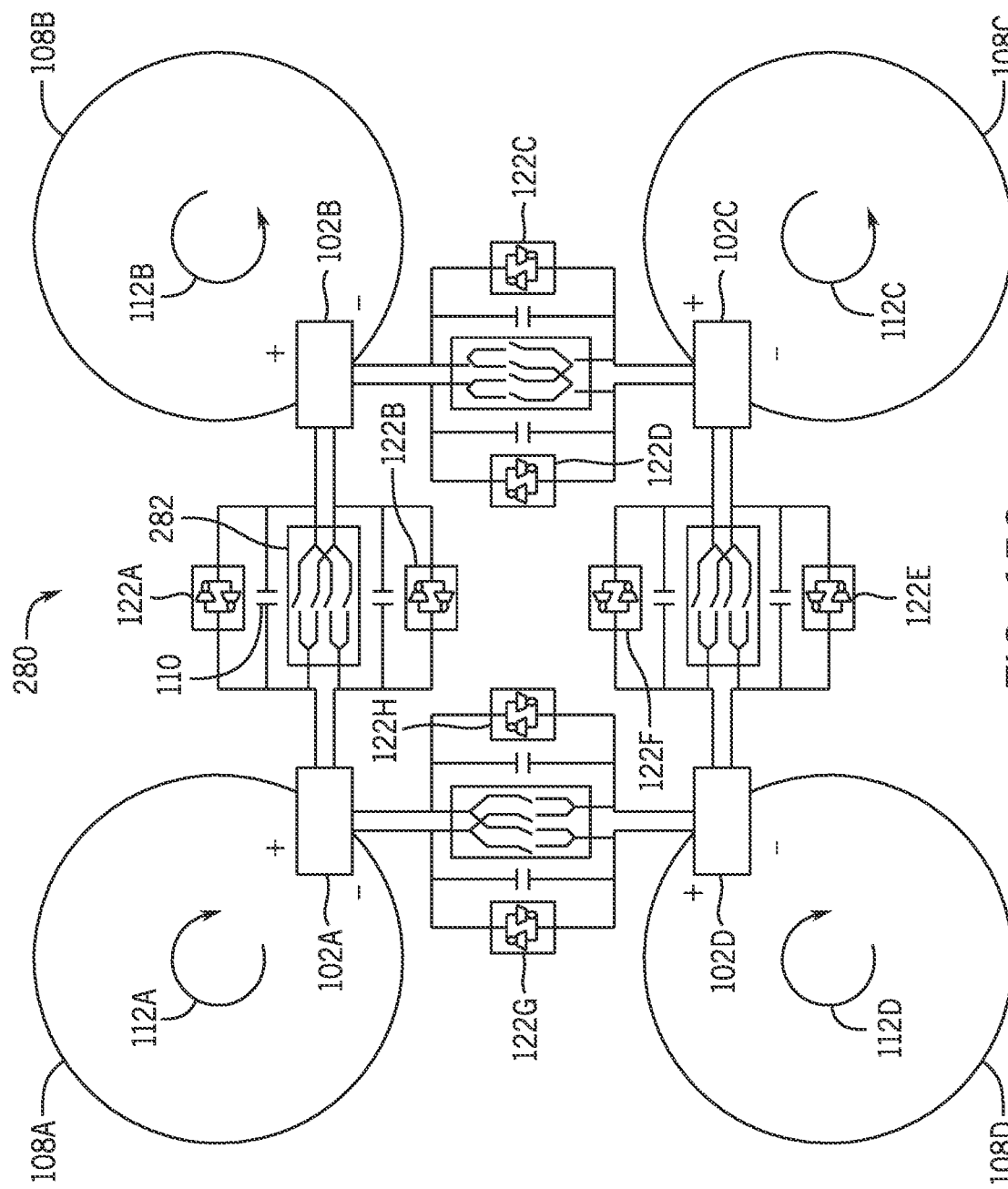
FIG. 15C is the example implementation of the VCO circuitry of FIG. 15A operating in a third mode (e.g., Mode 2), according to an embodiment of the present disclosure.

FIG. 15C is the example implementation 280 of VCO circuitry 67, 85 of FIG. 15A operating in a third mode (e.g., Mode 2), according to an embodiment of the present disclosure. As illustrated, Mode 2 may include current directions 112 in two inductors 108 of adjacent cores 102 having a first current direction (e.g., as such, the two adjacent cores 102 are out-of-phase), and current directions 112 in two other inductors 108 of two other adjacent cores 102 having a second current direction different from the first current direction (e.g., as such, the two other adjacent cores 102 are out-of-phase). That is, the current directions 112A, 112D (e.g., clockwise) of the first and fourth inductors 108A, 108D of the first and fourth cores 102A, 102D are the same, and the current directions 112B, 112C (e.g., counterclockwise) of the second and third inductors 108B, 108C of adjacent second and third cores 102B, 102C are the same, but different from the current directions 112A, 112D of the first and fourth inductors 108A, 108D of the first and fourth cores 102A, 102D. As such, the first core 102A is in phase with the second core 102B, the third core 102C is in phase with the fourth core 102D, but the first core 102A is out of phase with the fourth core 102D, and the second core 102B is out of phase with the third core 102C.

Figure 15D:
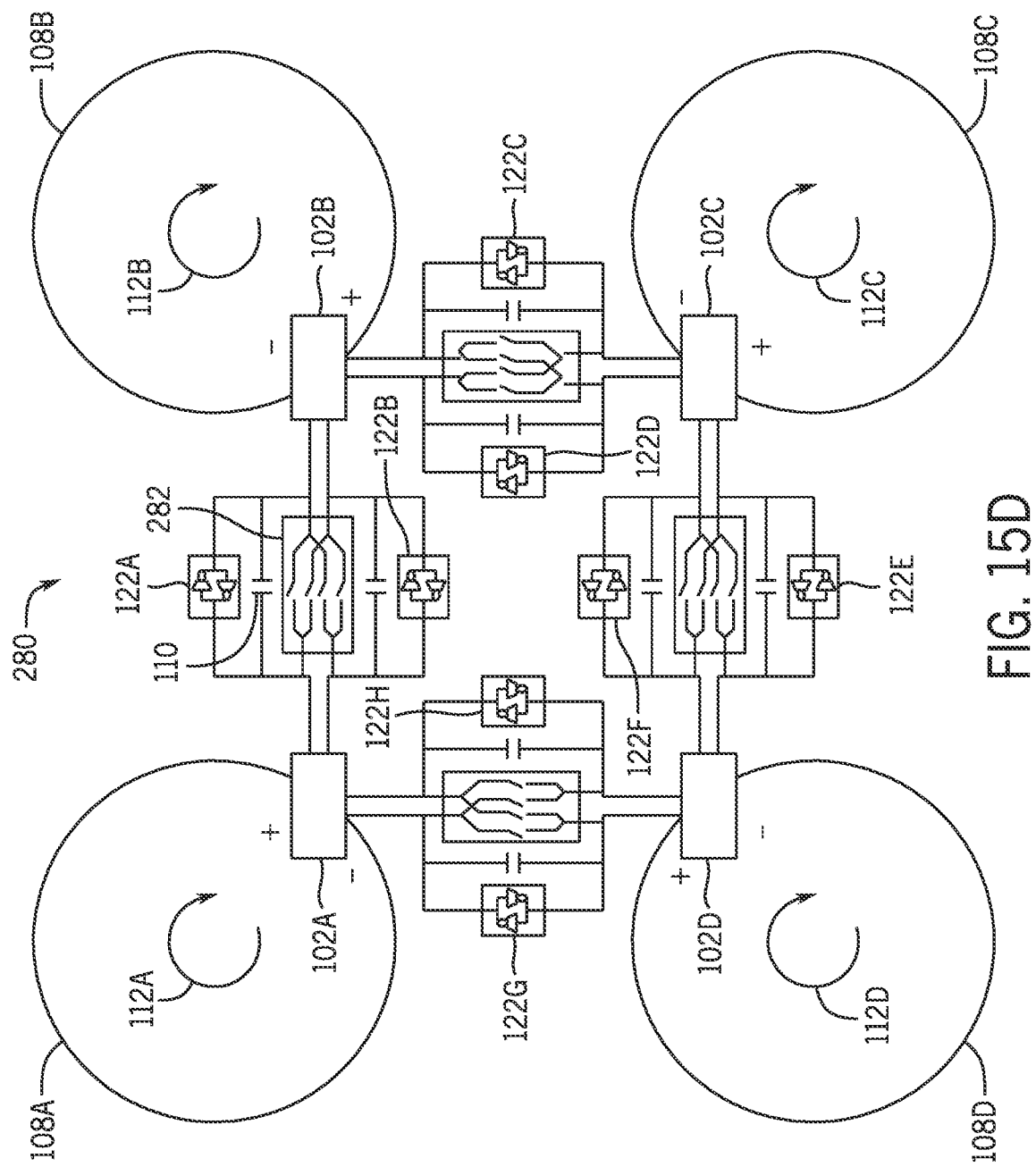
FIG. 15D is the example implementation of the VCO circuitry of FIG. 15A operating in a fourth mode (e.g., Mode 3), according to an embodiment of the present disclosure.

FIG. 15D is the example implementation 280 of VCO circuitry 67, 85 of FIG. 15A operating in a fourth mode (e.g., Mode 3), according to an embodiment of the present disclosure. As illustrated, Mode 3 may include current directions 112 in all four inductors 108 of the cores 102 having the same current direction (e.g., as such, all four cores 102 are out-of-phase. That is, the current directions 112A-D (e.g., clockwise) of all four inductors 108A-D of all four cores 102A-D are the same. As such, all four cores 102A-D are out of phase with one another. As explained in detail above, the mode boosters 122 may facilitate a desired mode to be dominant over undesired modes by boosting a startup gain of the desired mode while weakening startup gains of undesired modes.

Figure 16:
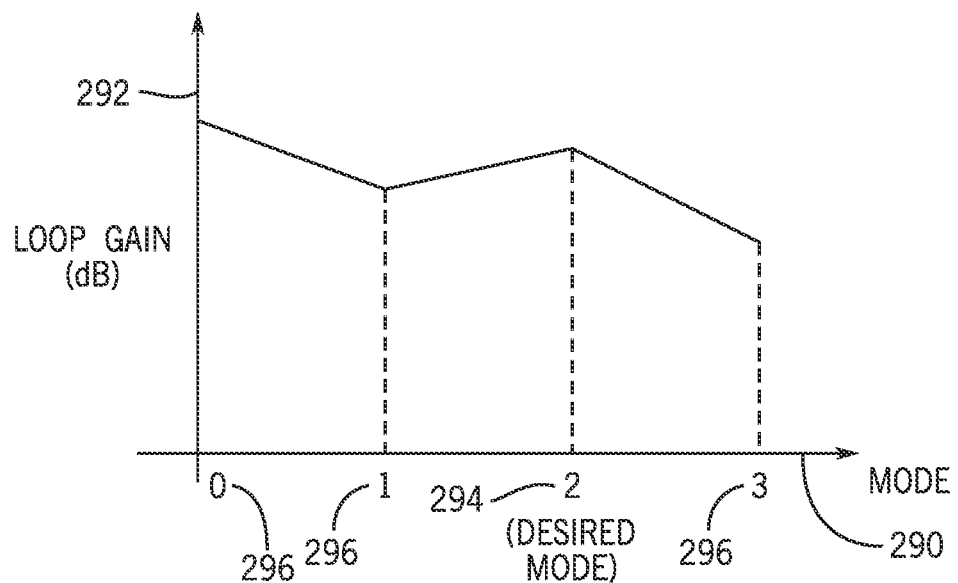
FIG. 16 is a plot illustrating operation of VCO circuitry without the mode boosters illustrated in FIG. 7.

FIG. 16 is a plot illustrating operation of VCO circuitry without the mode boosters 122 illustrated in FIG. 7. The plot includes a horizontal or x-axis 290 representing the different modes in which the VCO circuitry 67, 85 may operate (e.g., Mode 0, Mode 1, Mode 2, and Mode 3), and a vertical or y-axis 292 represents loop gain (e.g., in decibels). In particular, Modes 0-3 shown on the horizontal axis 290 correspond to the Modes shown in FIGS. 15A-D. In the example shown in FIG. 16, Mode 2 is desired 294, and Modes 0, 1, and 3 are undesired 296. Without the mode boosters 122 illustrated in FIG. 7, Mode 0 may surpass Mode 2 and become dominant, as Mode 2 may have larger capacitances 110 between its cores 102 that have same current direction and lower tank quality factor when compared with those of Mode 0. That is, the capacitances 110 between the out-of-phase cores (e.g., the first and fourth cores 102A, 102D and the second and third cores 102B, 102C) may be larger, causing a lower tank quality factor in the VCO circuitry 67, 85 when operating in Mode 2 compared to operating in Mode 0.

Figure 17:
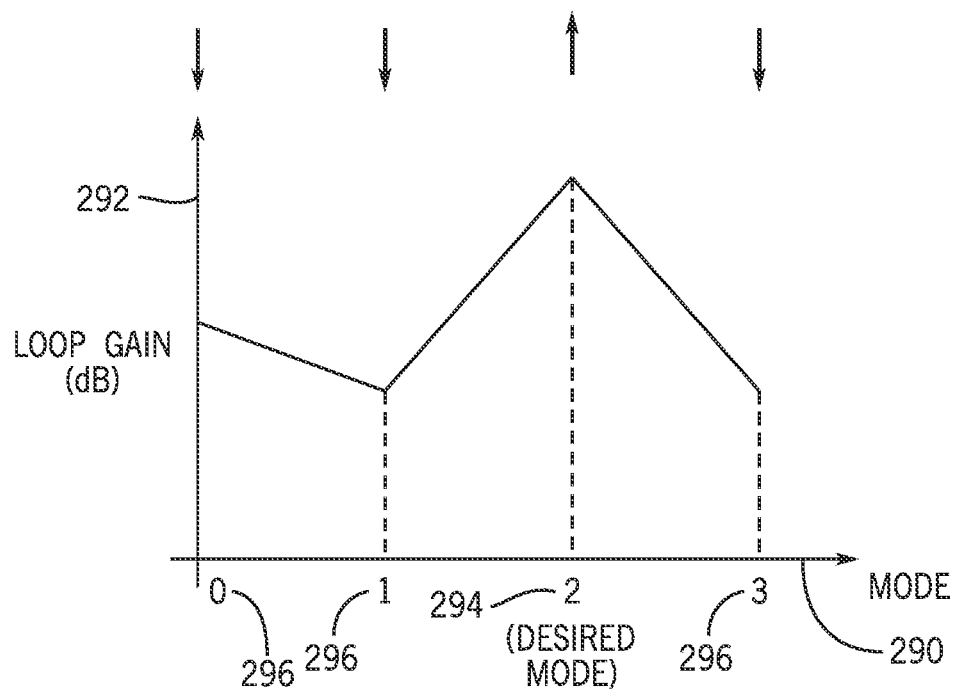
FIG. 17 is a plot illustrating operation of the example implementation of VCO circuitry of FIGS. 15A-D, according to an embodiment of the present disclosure.

FIG. 17 is a plot illustrating operation of the example implementation 280 of VCO circuitry 67, 85 of FIGS. 15A-D, according to an embodiment of the present disclosure. As shown, operating the mode boosters 122 to boost the startup gain (e.g., as indicated by the upward arrow) associated with desired Mode 2 294 and decreasing or weakening the startup gain (e.g., as indicated by the downward arrows) associated with the undesired modes 296 (e.g., as discussed above) may ensure that desired Mode 2 294 is dominant over (e.g., has a greater loop gain compared to) the undesired operating modes 296 (e.g., Modes 0, 1, and 3) and remains dominant (e.g., continues to have a greater loop gain compared to the undesired operating modes 296).

Figure 18:
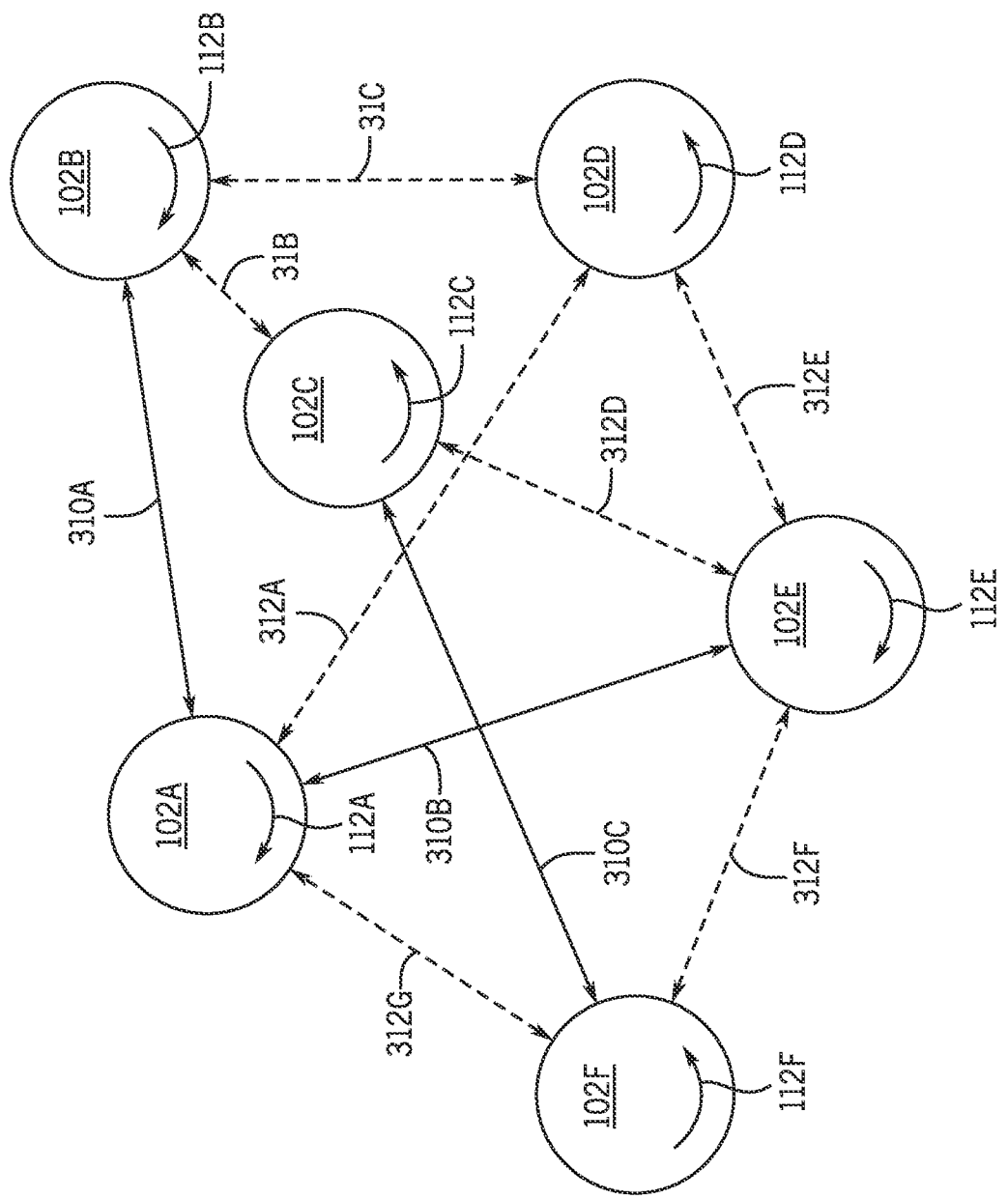
FIG. 18 is a representative diagram of the VCO circuitry of the electronic device of FIG. 1 having N cores and corresponding mode boosters, according to an embodiment of the present disclosure.

It should be understood that the example implementation 280 of VCO circuitry 67, 85 shown in FIGS. 15A-D is purely an example, and any suitable number of cores (e.g., more or less cores), components (e.g., more or less components), operating modes (e.g., more or less operating modes), and so on, are contemplated. In particular, the VCO circuitry 67, 85 may have any suitable (e.g., N) number of cores 102 and corresponding mode (or gain) boosters. FIG. 18 is a representative diagram of the VCO circuitry 67, 85 having N cores 102A-F (collectively 102) and corresponding mode boosters 122, according to an embodiment of the present disclosure. While FIG. 18 shows N being six cores 102, it should be understood that representative diagram of the VCO circuitry 67, 85 is meant to illustrate that any suitable number N of cores 102 (e.g., two or more, four or more, six or more, eight or more, ten or more, twelve or more, twenty or more, and so on) may be implemented in the VCO circuitry 67, 85. Inductor currents 112A-F of in each inductor 108 of each core 102A-F are also shown. As such, in-phase mode boosters 310A-C are shown between in-phase cores (e.g., between cores 102A and 102B, between cores 102A and 102E, and between cores 102C and 102F) and out-of-phase boosters 312A-G are shown between out-of-phase cores (e.g., between cores 102A and 102D, between cores 102B and 102C, between cores 102B and 102D, between cores 102C and 102E, between cores 102D and 102E, between cores 102E and 102F, and between cores 102A and 102F).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A voltage-controlled oscillator comprising:
a core comprising a positive terminal and a negative terminal;
a first gain booster coupled to the positive terminal, the first gain booster comprising a first set of transconductance cells coupled end to end via a first disable transistor that is configured to be disabled when the core is in an in-phase operating mode; and
a second gain booster coupled to the negative terminal, the second gain booster comprising a second set of transconductance cells coupled end to end via a second disable transistor that is configured to be enabled when the core is in the in-phase operating mode.

2. The voltage-controlled oscillator of claim 1, wherein the core comprises an inductor coupled to the positive terminal and the negative terminal.

3. The voltage-controlled oscillator of claim 1, wherein the core comprises a resistor coupled to the positive terminal and the negative terminal.

4. The voltage-controlled oscillator of claim 1, wherein the core comprises a capacitor coupled to the positive terminal and the negative terminal.

5. The voltage-controlled oscillator of claim 1, wherein the core comprises a transistor coupled to the positive terminal and the negative terminal.

6. The voltage-controlled oscillator of claim 1, comprising a second core, the first gain booster and the second gain booster coupled to the second core.

7. The voltage-controlled oscillator of claim 6, wherein the second core comprises a second positive terminal and a second negative terminal, the first gain booster coupled to the second negative terminal and the second gain booster coupled to the second positive terminal.

8. The voltage-controlled oscillator of claim 6, wherein the second core comprises a second positive terminal and a second negative terminal, the first gain booster coupled to the second positive terminal and the second gain booster coupled to the second negative terminal.

9. The voltage-controlled oscillator of claim 1, wherein the first gain booster and the second gain booster are configured to decrease an undesired gain of an undesired operating mode of the core.

10. A method comprising:
receiving, at processing circuitry, an indication to operate a voltage-controlled oscillator in an in-phase operation mode, the voltage-controlled oscillator comprising a core and a first mode booster coupled to the core and a second mode booster coupled to the core, the first mode booster comprising a first set of transconductance cells coupled end to end via a first disable transistor, and the second mode booster comprising a second set of transconductance cells coupled end to end via a second disable transistor;
activating, via the processing circuitry, the second disable transistor based on the indication; and
deactivating, via the processing circuitry, the first disable transistor based on the indication.

11. The method of claim 10, wherein the first mode booster is coupled to a positive terminal of the core, and the second mode booster is coupled to a negative terminal of the core.

12. The method of claim 11, wherein the first mode booster and the second mode booster are coupled to a second negative terminal of a second core.

13. The method of claim 12, wherein the in-phase operation mode is associated with the core and the second core being in phase.

14. The method of claim 11, wherein the first mode booster and the second mode booster are coupled to a second positive terminal of a second core.

15. The method of claim 14, wherein the in-phase operation mode is associated with the core and the second core being in out of phase.

16. The method of claim 10, wherein the voltage-controlled oscillator comprises a third mode booster and a fourth mode booster coupled to the core.

17. The method of claim 16, comprising:
activating, via the processing circuitry, the third mode booster based on the in-phase operation mode; and
deactivating, via the processing circuitry, the fourth mode booster based on the in-phase operation mode.

18. An electronic device, comprising:
a transceiver having a voltage-controlled oscillator comprising a core, a first gain booster coupled to the core, and a second gain booster coupled to the core, the first gain booster comprising a first set of transconductance cells coupled end to end via a first disable transistor, and the second gain booster comprising a second set of transconductance cells coupled end to end via a second disable transistor; and
processing circuitry configured to disable the first disable transistor and enable the second disable transistor based on operating the voltage-controlled oscillator in an in-phase mode.

19. The electronic device of claim 18, wherein the processing circuitry is configured to enable the first gain booster and the second gain booster based on operating the voltage-controlled oscillator in an out-of-phase mode.

20. The electronic device of claim 18, wherein the processing circuitry is configured to disable the first gain booster and the second gain booster based on operating the voltage-controlled oscillator in the in-phase mode.

* * * * *